(12) United States Patent
Kameyama et al.

(10) Patent No.: US 6,455,901 B2
(45) Date of Patent: Sep. 24, 2002

(54) SEMICONDUCTOR INTEGRATED CIRCUIT

(75) Inventors: Atsushi Kameyama, Tokyo (JP);
Tsuneaki Fuse, Tokyo (JP); Masako Yoshida, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/803,944

(22) Filed: Mar. 13, 2001

(30) Foreign Application Priority Data

Mar. 30, 2000 (JP) ........................................ 2000-093934

(51) Int. Cl.[7] .............................................. H01L 31/062
(52) U.S. Cl. ........................ 257/371; 257/369; 257/501; 438/128; 438/129; 438/199
(58) Field of Search ................................. 257/203, 207, 257/369, 351, 371, 500–502; 438/129, 128, 199; 323/237, 254, 257, 258, 263, 265, 292, 300, 907; 363/13–147

(56) References Cited

U.S. PATENT DOCUMENTS 5,966,319 A * 10/1999 Sato ............................ 365/154
6,172,901 B1 * 1/2001 Portacci ...................... 365/154

* cited by examiner

*Primary Examiner*—Nathan J. Flynn
*Assistant Examiner*—Scott R. Wilson
(74) *Attorney, Agent, or Firm*—Finnegan, Henderson, Farabow, Garrett & Dunner, L.L.P.

(57) ABSTRACT

A semiconductor integrated circuit has a logic circuit operated at a small power supply voltage of about 0.5V, wherein a noise margin of the logic circuit can be set at a larger value even if characteristics of the circuit vary depending upon manufacturing process conditions. Satisfactory speed can be ensured during an operation and power consumption can be reduced during a stand-by time. This is attained by controlling individual potentials of first and second conductivity type wells in which a logic circuit is formed. For this purpose, two voltage supply circuits for controlling voltages of the wells and a logic threshold voltage generator are provided.

20 Claims, 8 Drawing Sheets

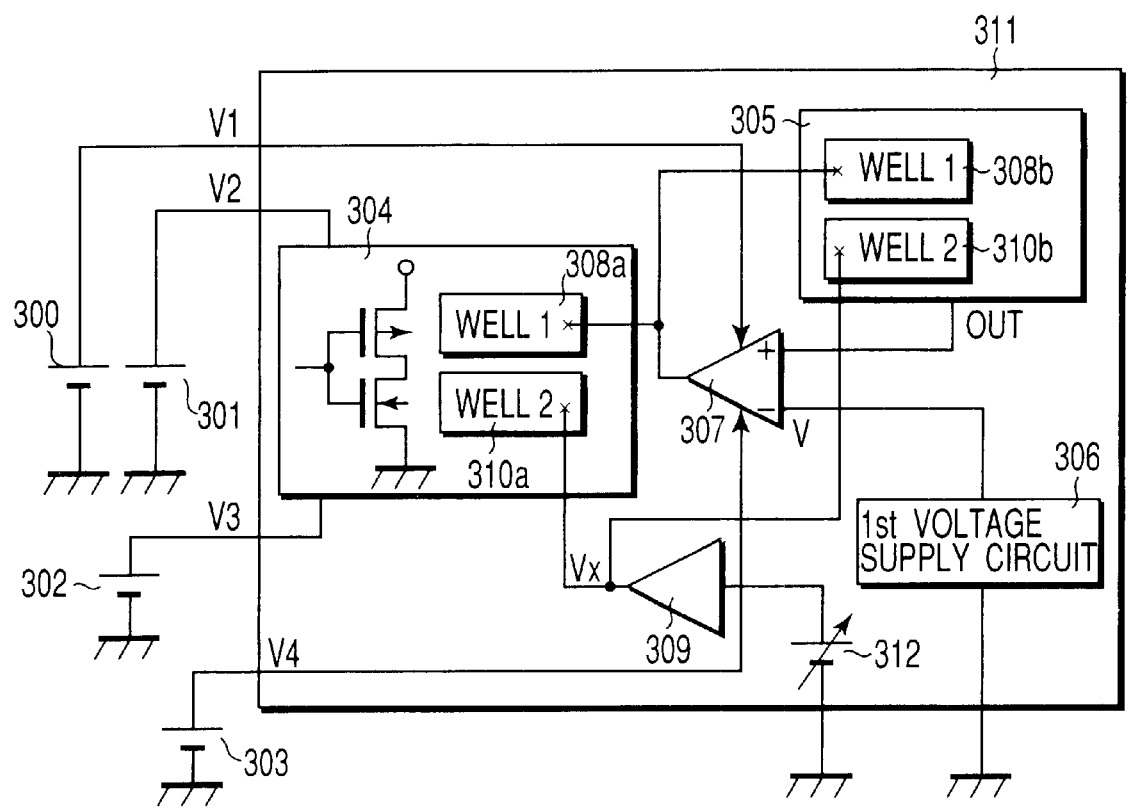
F I G. 7
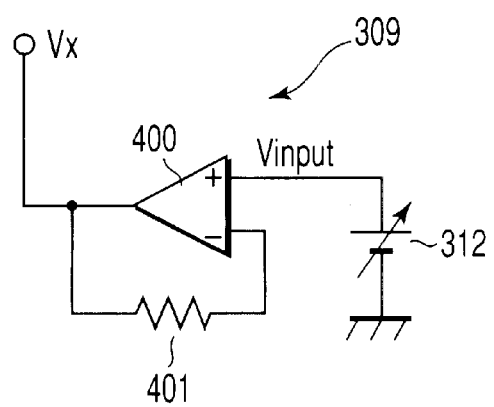
F I G. 8

SEMICONDUCTOR INTEGRATED CIRCUIT

CROSS-REFERENCE TO RELATED APPLICATIONS

This application is based upon and claims the benefit of priority from the prior Japanese Patent Application No. 2000-093934, filed Mar. 30, 2000, the entire contents of which are incorporated herein by reference.

BACKGROUND OF THE INVENTION

The present invention relates to a semiconductor integrated circuit, and more specifically, to a semiconductor integrated circuit operated under a plurality of power supply sources and comprising a complementary MIS logic circuit operated at low power supply voltage.

Recently, the number of semiconductor elements formed on a chip has significantly increased. Several hundreds of millions of semiconductor elements are integrated per chip in a gigabit-order semiconductor memory, and several tens of thousands to tens of millions of semiconductor elements are integrated per chip in a 64-bit microprocessor. The number of semiconductor elements formed on a chip can be improved by reducing the size of semiconductor elements. An MOS transistor having a gate length of 0.15 micrometers is now used in a 1 G-bit DRAM (Dynamic Random Access Memory). An MOS transistor having a gate length of 0.1 micrometer or less will be employed in the future as the number of semiconductor elements formed on a chip is further increased.

However, the miniaturized MOS transistors are degraded due to hot carriers and a dielectric film breakdown due to TDDB (time dependent dielectric breakdown). In addition, as a channel length of an FET decreases, a threshold voltage of the FET also decreases. To prevent the threshold voltage from decreasing, an impurity concentration of a substrate region or a channel region of the FET is increased. However, as the impurity concentration increases, a source/drain junction voltage of the FET also decreases.

Reducing a power supply voltage is effective in maintaining the reliability of miniaturized MOS transistors and FETS. More specifically, by reducing the power supply voltage, the electric field in a lateral direction between the source and drain is weakened preventing the generation of hot carriers. Furthermore, by reducing the power supply voltage, the electric field in a longitudinal direction between the gate and bulk is weakened preventing TDDB. Furthermore, a reverse bias voltage applied to the junction between the drain and bulk is decreased by reducing the power supply voltage. In this way, it is possible to cope with a decrease in a breakdown voltage of the junction.

Recently, the market for portable information devices has remarkably increased. Most of the portable information devices employ a lightweight power supply, such as a lithium ion battery having a high energy density. However, the three volts (3V) of the lithium ion battery is higher than the breakdown voltage of a miniaturized MOS transistor. Therefore, when the lithium ion battery is applied to a circuit comprising a miniaturized transistor, a power supply voltage converter must be used to reduce the voltage. The power consumed during the operation of a CMOS circuit used in a logic circuit is not only proportional to an operational frequency, but also proportional to the square of the power supply voltage. Therefore, reducing the power supply voltage significantly lowers the power consumption in the chip.

Using a portable device for a long time requires using a battery with a high energy density, having a highly efficient power supply voltage converter, and operating an integrated circuit at a low voltage. Power consumption can be saved further if a reduced power supply voltage can be used in a power-consuming microprocessor and base band LSI.

The portable information device also requires a memory device such as a DRAM or an SRAM in addition to logic circuits. However, unlike with logic circuits, attempts to reduce power consumption in memory devices have not been aggressively made. To reduce soft errors in a DRAM, a sufficient amount of electric charge must be kept in a cell in the DRAM. Furthermore, low speed operation at a low power supply voltage in the SRAM must be avoided.

Therefore, at present, only elements capable of operation at a power supply voltage of about 1.5V are put to practical use. However, since a logic circuit can operate at a voltage far smaller than the power supply voltage for a memory device, a multi-power source capable of supplying various power supply voltages is used in an LSI comprising memory circuits and logic circuits.

FIG. 1 shows a semiconductor integrated circuit 604, for use in portable information devices, in which an on-chip memory circuit 603 and a logic circuit 602 are integrated in the same chip. Its power supply system is also shown in FIG. 1.

The power supply system includes a lithium ion secondary battery 600 and a power supply voltage converter 601. The output voltage, 3V, of the lithium battery 600 is converted to 0.5V by the power supply voltage converter 601. The converted voltage is supplied to the logic circuit 602. Since the on-chip memory circuit 603 generally requires a power supply voltage of 1.5V to 2.0V or more for operation, a power supply voltage of 3V is supplied to the memory circuit 603 from the lithium battery 600.

In the circuit arrangement of FIG. 1, if the power supply voltage to the logic circuit can be reduced from 3V to about 0.5V, the power consumption during the operation time can be drastically reduced by 95%, in theory. However, if the power supply voltage for a general CMOS circuit operating at 3V to 2V is just simply reduced, the operation speed of the CMOS circuit is lowered or the operation stops.

To overcome these problems, a threshold voltage of a MOS transistor must be reduced along with a decrease in a power supply voltage. To construct a logic circuit that operates at a low power supply voltage of 0.5V, for example, a MOSFET having a threshold voltage of about 0.1 to 0.15V, which is about ⅓ of the threshold voltage of a conventional MOSFET, should be used.

However, with such a low threshold voltage, the leakage current during an off-time of a MOSFET drastically increases by a factor of 100 if an S factor, which determines a sub-threshold characteristic of a MOSFET, is 100 mA/decade, for example. Therefore, although the power consumption during an operation time is reduced simply by reducing the power supply voltage, the power consumption during a stand-by time is significantly increased. This means that the usable time of a device is shortened due to the stand-by time power consumption. Therefore, the reduced power supply voltage application as mentioned above is not suitable for semiconductor integrated circuits used in portable information devices.

FIG. 2 shows an improved circuit to overcome the aforementioned problems. In the circuit, an extremely low voltage of 0.5V is supplied to a semiconductor integrated circuit 705 by a power supply voltage converter 701 and a power supply voltage VD1 (0.5V) is supplied to a logic circuit 702. This attains low power consumption during an operation time.

Furthermore, a positive voltage generator 703 and a negative power voltage generator 704 are provided to generate a voltage that is greater than a power supply voltage VD1 and a voltage that is less than a ground potential VSS, respectively.

The supply voltages generated by the voltage generators 703 and 704 are applied to an n-well and a p-well of the logic circuit 702, respectively, to reduce an absolute value of a threshold voltage of the MOSFETs in the logic circuit 702 during a normal operation time to increase the operation speed. In addition, the absolute value of the threshold voltage of the MOSFETs within the logic circuit 702 is increased during the stand-by time to reduce the leakage current during the OFF-time to lower the power consumption.

However, when supplying an extremely low power supply voltage of 0.5V, problems usually occur. For example, a charge pump system is usually used for the positive voltage generator 703 and the negative voltage generator 704 in the semiconductor integrated circuit. However, the charge pump system does not have a sufficient driving capacity to control a well potential when the power supply voltage is as low as 0.5V. To increase the driving capacity of the charge pump system when the power supply voltage is as low as 0.5V, the size of the driver MOSFET must be increased to an extremely large size. Consequently, the layout areas of the voltage generators 703 and 704 become larger than that of the conventional circuit.

Furthermore, since a power supply voltage of 1.5V or more is required for the on-chip memory circuit, another power supply voltage is needed. In addition, since a power supply voltage for the logic circuit 702 is as low as 0.5V, the noise margin of the gate circuit may be reduced. In the worst case, depending upon the threshold voltage of the MOSFET within the logic circuit, the circuit cannot operate.

FIG. 3 shows a circuit diagram also designed to overcome the leakage current problem during the OFF-time. Three types of power supply voltages are provided in a semiconductor integrated circuit 805. A 3V power supply voltage (VDD) from a secondary battery 800 and a ground potential (VSS) are supplied to a memory circuit 804, which is integrated within the semiconductor integrated circuit 805. At the same time, a power supply voltage VD1 (0.5V) supplied from a power supply voltage converter 801 is connected to a power supply line VDDV for a logic circuit 802 via a p-channel MOSFET 803 having a high threshold voltage.

In the circuit of FIG. 3, before a stand-by time, it is necessary to save data of a flip-flop within the logic circuit 802 in the memory circuit 804 since the power supply to the logic circuit 802 is turned off during the stand-by time. After the data within the logic circuit 802 is saved in the memory circuit 804, the power supply voltage VDD is applied to the gate of the p-channel MOSFET 803, during the stand-by time, which turns off the MOSFET 803. At that time, the leakage current becomes extremely small since the leakage current is determined by the OFF-characteristics of the p-channel MOSFET 803 having a large threshold voltage.

Furthermore, the noise margin of the gate circuit may be insufficient since a power supply voltage for the logic circuit 802 is 0.5V. As a result, depending upon variation of the threshold voltage of the MOSFETs in the logic circuit 803, the circuit may not operate. Furthermore, when an extremely low voltage of 0.5V is supplied, the power supply voltage becomes noticeably reduced because of an on-resistance of the switch transistor 803. As a result, the circuit margin may further decrease or the power supply efficiency may decrease.

The reason the circuit margin of the logic gate decreases when the power supply voltage decreases to 0.5V will be explained more specifically. FIG. 4 is a graph showing a circuit noise margin obtained by a circuit simulation using a threshold voltage $V_{thP}$ of a p-channel MOSFET and a threshold voltage $V_{thN}$ of an n-channel MOSFET as parameters under the following conditions: a circuit having 4-input NAND gates and 4-input NOR gates formed using a 0.25 $\mu$m process technique is operated under the worst conditions described later. The n-well potential is 0.45V and the p-well potential is 0.0V. The input signals other than the target signal are set so as to render the gate OFF. More specifically, the power supply voltage is applied to the NAND gate as an input signal and the ground potential is applied to the NOR gate as an input signal. The temperature of the MOSFET is set at 85° C., which is an upper limit of a junction temperature, and the power supply voltage is 0.45V. It is assumed that the power supply voltage does not drop and the ground potential does not increase.

The noise margin is determined under the worst conditions where a noise source signal "vn" is applied as the input signal of the NAND gate and a noise source signal "-vn" is applied as the input signal of the NOR gate. From FIG. 4, it is found that the largest circuit noise margin is obtained when $V_{thP}=-V_{thN}$. More specifically, since the noise margin is about 0.135V at a threshold condition (i.e., $V_{thP}=-0.10V$, $V_{thN}=0.10V$), which is suitable when the power supply voltage is 0.5V, the operation of the LSI can be ensured to some extent.

However, when the threshold voltage $V_{thN}$ of the n-channel MOSFET is shifted toward a minus side by about 0.3V, that is, $V_{thP}=-0.10V$, $V_{thN}=-0.20V$, the circuit margin is 20 mV, which is almost the same as the thermal noise. Furthermore, when the threshold voltage $V_{thN}$ is shifted by about 0.2V, that is, $V_{thP}=-0.10V$, $V_{thN}=-0.10V$, the circuit noise margin is 54 mV. As a matter of fact, not only does the temperature condition and power supply voltage change, but also, the power supply voltage decreases and the ground potential increases. In the worst-case condition, the noise margin decreases by about 50 mV. Therefore, even if the threshold voltage changes only by about 0.2V, it seems difficult to perform a normal operation of the circuit within the LSI.

As described above, even in a complementary MOS circuit having a sufficient circuit margin, the circuit margin sometimes becomes almost zero at a power supply voltage of about 0.5V. This phenomenon occurs because the threshold voltage of a device varies depending on the manufacturing process.

A transfer delay time is 260 ps/stage when $V_{thP}=-0.10V$ and $V_{thN}=0.10V$. When $V_{thN}=-0.20V$ and $V_{thP}=-0.10V$, the transfer delay time becomes as fast as 200 ps. Conversely, when $V_{thN}=0.30V$ and $V_{thP}=-0.10V$, the transfer delay time significantly degrades to 947 ps. In this case, since the noise margin is 72 mV, it seems possible that the operation can be functionally performed. Nevertheless, since the gate speed decreases to ⅕, it is difficult to put a circuit of this type to practical use.

Since the logic circuit capable of being operated at 0.5V has little allowance for changes in its manufacturing process, but its low power consumption is advantageous during the stand-by time, it must be operated with a sufficient circuit margin during the operation time. To control the circuit margin and the transfer delay time within a preset range, a processing technique must be established. More specifically, the threshold voltage of the MOSFET must be controlled so that it does not vary by more than ±0.05V. However, this approach inevitably increases the cost of the semiconductor integrated circuit.

In a semiconductor integrated circuit for use in portable devices, low power consumption during operation time and stand-by time while satisfying the speed requirement during the operation is necessary. To attain low power consumption during the stand-by time, for example, the following two methods are known. Controlling a well potential by generating a voltage on a chip, having a magnitude of no less than the power supply voltage and no more than the ground potential of the logic circuit in the semiconductor integrated circuit is one method of attaining low power consumption during the stand-by time. Forming a power-supply switch using a FET having good off-characteristics is the second method. These methods are effective in attaining low power consumption during the stand-by time. However, if a power supply voltage of about 0.5V is used in order to attain the low power consumption during the operation time, the following problems exist:

1) A larger layout area is required due to the presence of the voltage generator;
2) The circuit stability decreases if the power supply voltage is dropped by a power switch FET; and
3) The circuit noise margin decreases if manufacturing process conditions for forming the 0.5V logic circuit vary.

Specifically, the circuit noise margin of the gate within the logic circuit operated at a power supply voltage of 0.5V is extremely low. Therefore, the functional operation margin is small when the device parameter is varied depending upon changes in manufacturing process conditions. As a result, a sufficient yield cannot be ensured as a semiconductor integrated circuit in a functional test.

When the yield is ensured to a certain level, if the device parameter varies, an operation speed will be changed. Even if the functional operation can be ensured, the yield of the chips satisfying the specification of speed decreases.

As described above, in the semiconductor integrated circuit for use in portable devices, since the allowance range of parameters for the device is narrow, element characteristics must be controlled strictly and a process step must be added. As a result, the cost inevitably increases. Furthermore, as compared to ordinary products, the yield of such a semiconductor integrated circuit is low. Therefore, the cost of the integrated circuit further increases.

BRIEF SUMMARY OF THE INVENTION

Semiconductor integrated circuits consistent with the present invention substantially obviate one or more of the above described drawbacks of the related art.

In accordance with the present invention, there is provided a semiconductor integrated circuit comprising:
  a semiconductor substrate having a first well of a first conductivity type, a second well of a first conductivity type, a first well of a second conductivity type, and a second well of a second conductivity type;
  a complementary MIS logic circuit having first elements formed in the first well of the first conductivity type and second elements formed in the first well of the second conductivity type;
  a logic-threshold-voltage generator for generating a voltage corresponding to a logic threshold voltage of the complementary MIS logic circuit, having a third element formed in the second well of the first conductivity type and a forth element formed in the second well of the second conductivity type;
  a first voltage supply circuit for supplying a first voltage V having a magnitude between a first and a second power supply voltage to the complementary MIS logic circuit, wherein the second power supply voltage is a reference voltage and different from the first power supply voltage;
  a differential amplification circuit wherein an output voltage of the logic-threshold-voltage generator is input to a positive terminal of the differential amplification circuit and wherein the first voltage V is input to a negative input terminal of the differential amplification circuit; and
  a second voltage supply circuit for supplying a second voltage Vx, wherein
    an output voltage of the differential amplification circuit is supplied to the first well of the first conductivity in which the first elements of the complementary MIS logic circuit is formed, and supplied to the second well of the first conductivity type, in which the third element of the logic-threshold-voltage generator is formed; and
    the second voltage Vx is supplied to the first well of the second conductivity type in which the second elements of the complementary MIS logic circuit is formed and supplied to the second well of the second conductivity type, in which the forth element of the logic-threshold-voltage-generator is formed.

Also, in accordance with the present invention there is provided a semiconductor integrated circuit comprising:
  a semiconductor substrate having a first well of a first conductivity type, a second well of a first conductivity type, a first well of a second conductivity type, and a second well of a second conductivity type;
  a first, second, third and fourth power supply line to which a first, second, third, and fourth power supply outputting a voltage V1, V2, V3, and V4 is connected, respectively, wherein V1>V2>V3>V4;
  a complementary MIS logic circuit, wherein power supply terminals of the complementary MIS logic circuit are connected to the second power supply line and the third power supply line, the complementary MIS logic circuit including:
    a second conductivity channel type MISFET formed in the first w ell of the first conductivity type; and
    a first conductivity channel type MISFET formed in the first well of the second conductivity type;
  a logic-threshold-voltage-generator for generating a voltage corresponding to a logic threshold voltage of the complementary MIS logic circuit, having a first circuit element formed in the second well of the first conductivity type and a second circuit element formed in the second well of the second conductivity type;
  a first voltage supply circuit for supplying a first voltage V satisfying V2>V>V3;
  a first differential amplification circuit wherein an output voltage o f the logic-threshold-voltage-generator is input to a positive input terminal of the amplification circuit and wherein the first voltage V is input to a negative input terminal of the amplification circuit; and
  a second voltage supply circuit for supplying a second voltage Vx,
  wherein an output terminal of the differential amplification circuit is connected to the first and second well of the first conductivity; and the second voltage vx is supplied to the first and second well of the second conductivity type.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 7 is a semiconductor integrated circuit according to a second embodiment of the present invention;

FIG. 8 is a voltage supply circuit for supplying a voltage to a second well, used in the second embodiment;

DETAILED DESCRIPTION OF THE INVENTION

Embodiments consistent with the present invention provide a semiconductor integrated circuit having a logic circuit operated at small power supply voltage of about 0.5V, wherein a circuit noise margin of the logic circuit can be set at a larger value even if characteristics of the circuit vary depending on changes in manufacturing process conditions.

Embodiments consistent with the present invention provide a semiconductor integrated circuit wherein a satisfactory operation speed can be ensured during an operation time and power consumption can be reduced during a stand-by time.

Embodiments consistent with the present invention include four power supplies different in voltage level connected to a semiconductor integrated circuit. The power supplies having the second highest and third highest voltages are supplied to a logic circuit. The output terminal of the CMOS logic-threshold-voltage generator of the CMOS (MIS) logic circuit in a logic circuit is connected to a positive input terminal of the differential amplifier. The voltage supplied from the voltage supply circuit is input to the negative input terminal of the differential amplifier. The output terminal of the differential amplifier is connected to the well of a first conductivity type within the logic circuit. Another voltage Vx is given to the well of a second conductivity type, which is an opposite type to the first conductivity type, within a same logic circuit. With this structure, it is possible to set the logic threshold voltage of the CMOS (MIS) logic circuit appropriately by the differential amplifier, regardless of the threshold voltage of a MISFET. As a result, the operation margin of the circuit can be set at a maximum value.

Further, in embodiments consistent with the present invention, since the voltage vx is given to the second conductivity type well, the well potential of the second conductivity type can be arbitrarily set independently of the first conductivity type well potential. As a result, the leakage current is reduced during the stand-by time, whereas a high speed operation can be performed during the operation time.

Furthermore, in embodiments consistent with the present invention, the CMOS logic-threshold-voltage generator can be simply formed with a small number of elements by mutually connecting gates and drains of a p-channel MISFET and an n-channel MISFET, using the V2 and V3 power supply voltages, respectively. Moreover, V1 and V4 are used as power supply voltages of the differential amplifier and the well of the differential amplifier is electrically isolated from the first conductivity type well and the second conductivity type well. Therefore, the operation range of the differential amplifier can be sufficiently broadened.

Now, embodiments of the present invention will be explained with reference to the accompanying drawings.

First Embodiment

Figure 1:
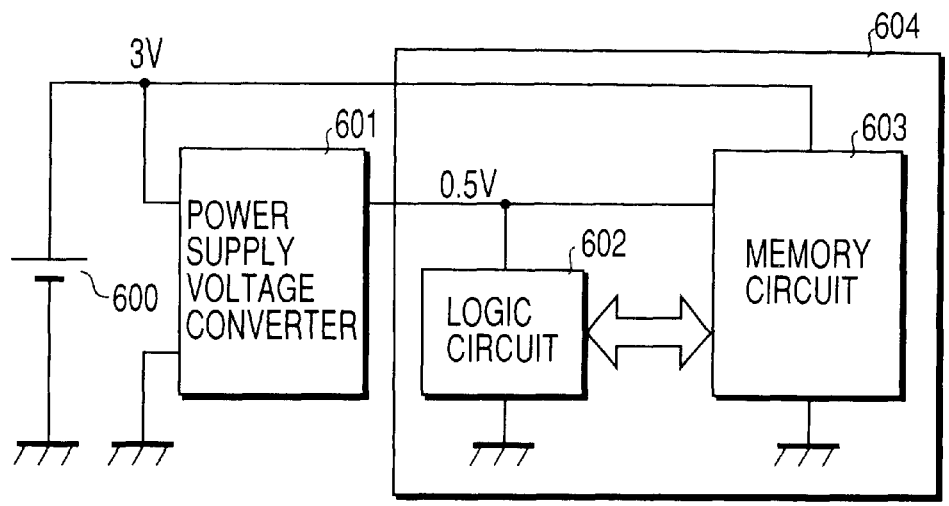
FIG. 1 is a block diagram showing a conventional low power-consumption semiconductor integrated circuit.
Figure 2:
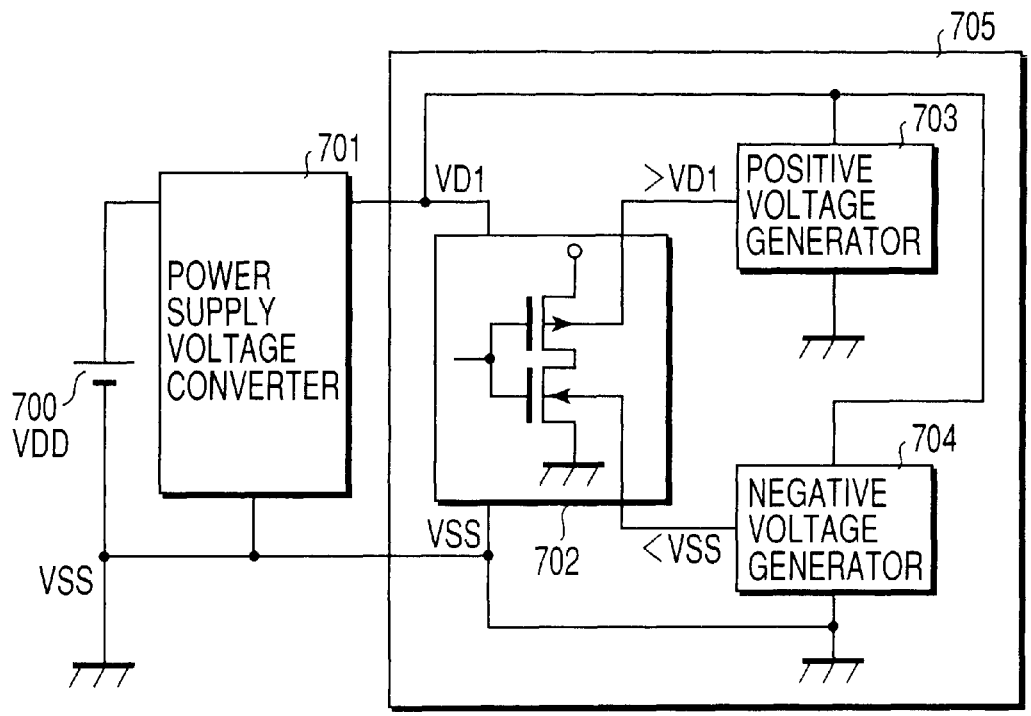
FIG. 2 is a block diagram showing another conventional low power-consumption semiconductor integrated circuit.
Figure 3:
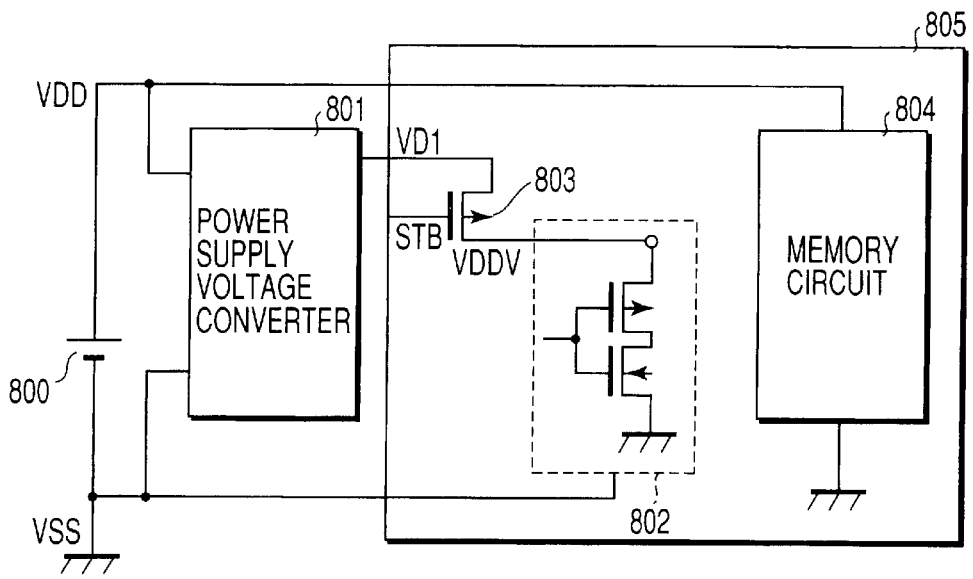
FIG. 3 is a block diagram showing still another conventional low power-consumption semiconductor integrated circuit.
Figure 4:
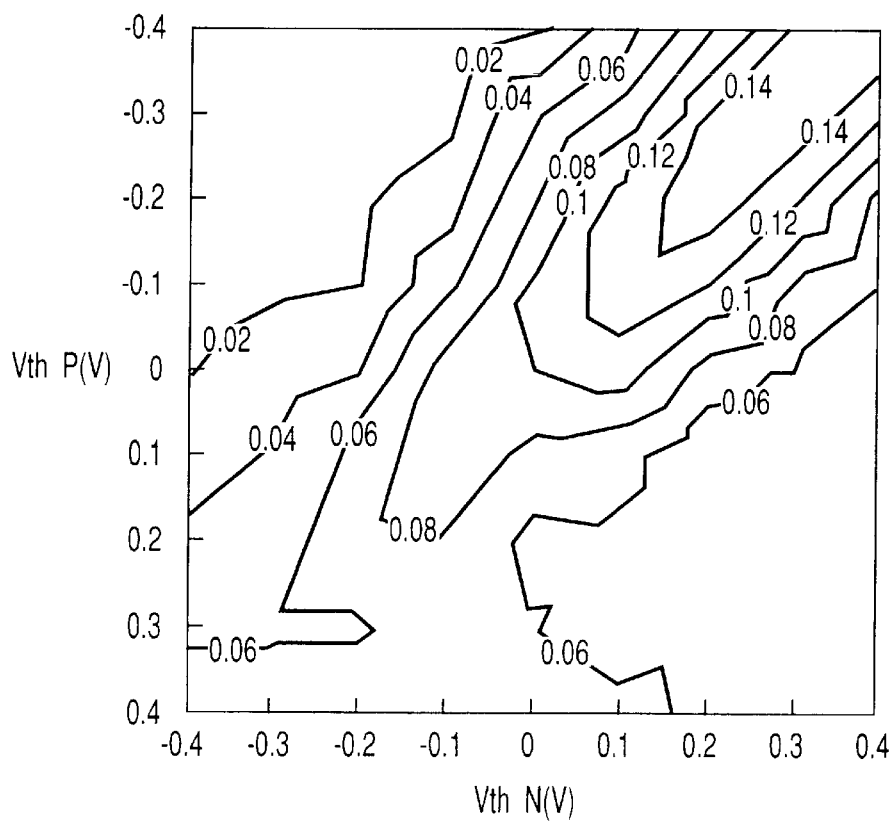
FIG. 4 is a graph showing the circuit noise margin of a CMOS circuit operated at 0.5V, the noise margin being obtained through simulation by using a threshold voltage VthP of a P channel MOSFET and a threshold voltage VthN of an N channel MOSFET as parameters.
Figure 5:
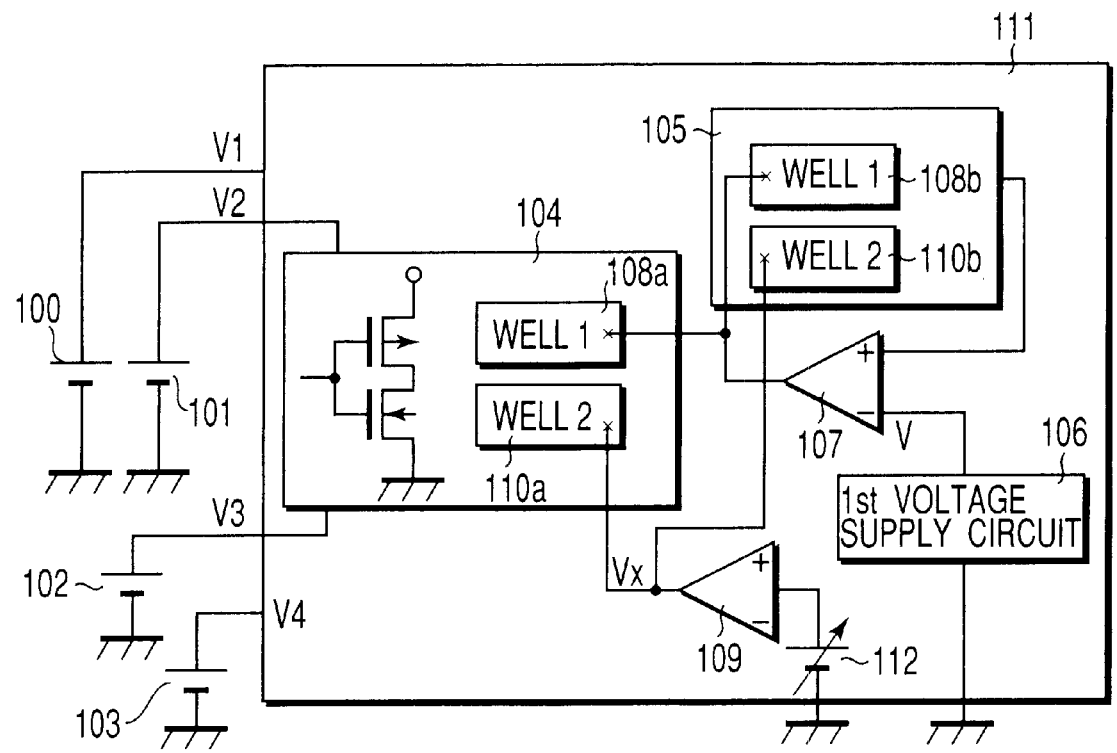
FIG. 5 is a block diagram showing a semiconductor integrated circuit according to a first embodiment of the present invention.

FIG. 5 shows a semiconductor integrated circuit 111 according to a first embodiment of the present invention. The semiconductor integrated circuit 111 is operated by four power sources 100, 101, 102 and 103 (including a ground potential or a reference potential), which supply voltages V1, V2, V3, and V4, respectively, to the semiconductor integrated circuit 111, where V1>V2>V3>V4.

The semiconductor integrated circuit 111 comprises a logic circuit 104, a CMOS logic-threshold-voltage generator 105, a first voltage supply circuit 106, and a differential amplification circuit 107. The logic circuit 104 includes a CMOS logic circuit and is operated by voltages V2 and V3 of power supplies 101 and 102, respectively. The CMOS logic-threshold-voltage generator 105 generates a threshold voltage of a CMOS logic circuit in the logic circuit 104. As the power supply voltages of the CMOS logic-threshold-voltage generator 105, V2 and V3 are supplied in the same manner as in the logic circuit 104.

The output of the CMOS logic-threshold-voltage generator 105 is supplied to a positive input terminal of the differential amplification circuit 107 and a voltage V output from the voltage supply circuit 106 where V2>V>V3 is supplied to a negative input terminal of the differential amplification circuit 107. The output of the differential amplifier 107 is supplied to the first conductivity type wells (well 1) 108a and 108b in the logic circuit 104 and the CMOS logic-threshold-voltage generator circuit 105, respectively.

In the semiconductor integrated circuit 111, an amplifier 109 (second voltage supply circuit) sets potentials of the second conductivity type wells (well 2) 110a and 110b in the logic circuit 104 and the CMOS Aft logic-threshold-voltage generator 105, respectively. The amplifier 109 performs impedance conversion of a variable voltage power supply 112, which is capable of outputting arbitrary voltages, and outputs a voltage Vx.

The power supply voltage of the differential amplifier circuit 107 and the amplifier 109 are not limited to V1, V2, V3, and V4. Any power supply voltage can be used.

It is possible to reduce power consumption by reducing a voltage amplitude during the operation, assuming: (1)V1 and V3 are the power supply voltages for the differential amplifier 107, which controls the potentials of the first wells 108a and 108b; (2)V2 and V4 are the power supply voltages of the amplifier 109, which controls the potentials of the second wells 110a and 110b; and (3)V1 and V4 are used as power supply voltages for a memory circuit provided in the semiconductor integrated circuit 111.

According to the first embodiment, the circuit threshold voltage within the logic circuit 104 becomes almost equal to the potential V, which is a potential of the voltage supply circuit 106, due to a negative feedback control via the differential amplifier 107. If the voltage V is set at a median value between the voltage V2 and the voltage V3, that is, (V2+V3)/2, the noise margin of the circuit can be maximized. In addition, the potential of the second conductivity-type well 110 can be arbitrarily set by amplifying the voltage from the variable voltage power supply 112 to Vx by the amplifier 109 and then supplying the amplified voltage Vx.

If the first conductivity-type wells 108a and 108b are n-wells and the second conductivity type wells 110a and 110b are p-wells, and if the potential Vx of the wells 110a and 110b is set lower than V3 during the stand-by time, it is possible to shift the threshold voltage of the n-channel MOSFET within the logic circuit 104 toward the plus side. As a result, a leakage current is suppressed. Conversely, if the voltage Vx is set higher than V3 during the operation time, the threshold voltage can be shifted toward the negative side. As a result, the operation speed of the circuit can be increased. Since the first well 108 and the second well 110 are separately controlled in either state, the circuit margin of the logic circuit is maximized.

Figure 6:
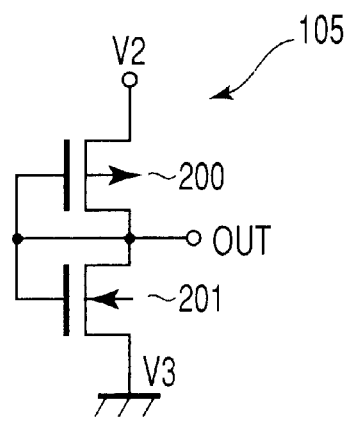
FIG. 6 is a CMOS logic-threshold-voltage generator for use in the first embodiment.

FIG. 6 shows a specific embodiment of the CMOS logic-threshold-voltage generator 105 according to the first embodiment. The CMOS logic-threshold-voltage generator 105 is an inverter comprising a p-channel MOSFET 200 and an n-channel MOSFET 201 connected to V2 and V3 via the source of the MOSFET 200 and 201, respectively. The logic threshold voltage of the logic circuit 104 is obtained by mutually connecting the input and output of the CMOS logic-threshold-voltage-generator 105. The p-channel MOSFET 200 is formed in the first well 108b and the n-channel MOSFET 201 is formed in the second well 110b.

The wells of the MOSFET in the logic-threshold-generator 105 are arranged in the same manner as in the logic circuit 104. More specifically, the first well 108b is connected to the output terminal of the differential amplifier 107 and the second well 110b is connected to the output terminal of the amplifier 109.

Figure 15:
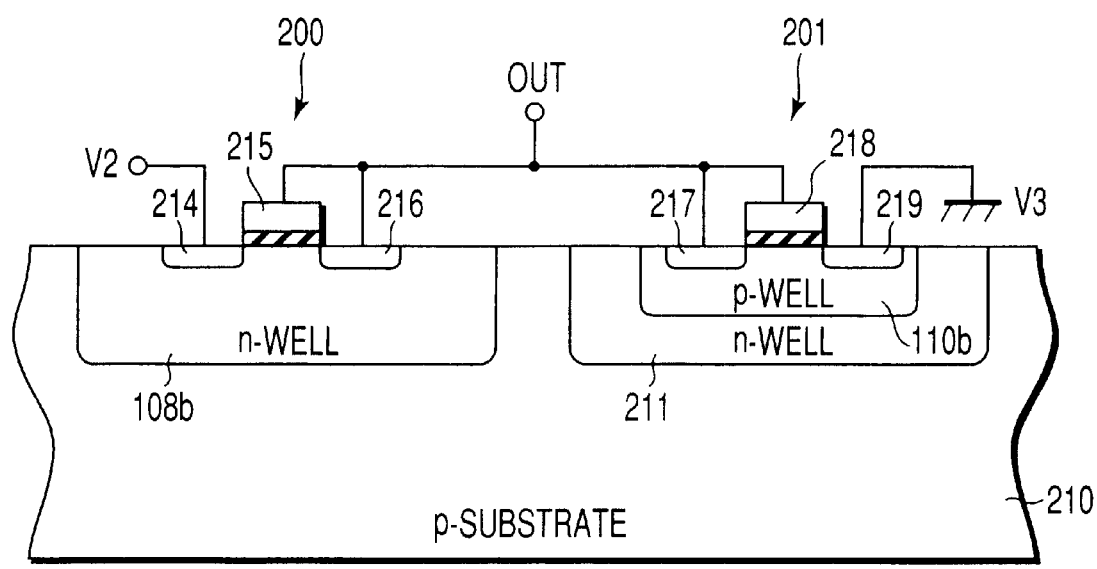
FIG. 15 shows a cross-sectional view of a semiconductor substrate having MOSFETs thereon, corresponding to a circuit configuration of FIG. 6, and schematic interconnections illustrated on the substrate.

FIG. 15 is a cross-sectional view of a semiconductor substrate 210 on which the CMOS logic-threshold-voltage generator of FIG. 6 is formed. In the semiconductor substrate 210, the p-channel MOSFET 200 is formed within the n-well 108b. The n-channel MOSFET 201 is formed within the p-well 110b, which is formed within another n-well 211. On the semiconductor substrate 210, interconnections of FIG. 6 are illustratively shown. A source 214 of MOSFET 200 is connected to a V2 power supply line, and a gate 215 and a drain 216 are connected to an output terminal OUT. A drain 217 and a gate 218 of MOSFET 201 are connected to the output terminal OUT, and a source 219 is connected to a V3 power supply line.

The output "OUT" of the CMOS inverter circuit shown in FIG. 6 is maintained at a stable point, which is determined by the circuit threshold voltage. The circuit threshold voltage of the CMOS inverter circuit is determined by the relationship between the threshold voltage of the p-channel MOSFET and that of the n-channel MOSFET. The threshold voltage of each of the MOSFETs varies depending upon the well potential. If the well potential of the MOSFET in the CMOS logic-threshold-voltage generator 105 is set to the well potential in the logic circuit 104, the OUT value comes to indicate an accurate circuit threshold voltage of the logic circuit 104.

Note that the CMOS logic-threshold-voltage generator 105 may be arranged within the logic circuit 104. To be more specific, the p well 110b and the n-well 108b of the CMOS logic-threshold-voltage generator 105 may be identical to the p-well 110a and the n-well 108a of the logic circuit 104, respectively, or may be separate ones electrically isolated from each other. However, the differential amplification circuit 107 must be electrically independent of the logic circuit 104 and the CMOS logic-threshold-voltage generator 105. Therefore, the well, in which the circuit element of differential amplification circuit 107 is formed, must be electrically isolated from the n-wells 108a, 108b and p-wells 110a, 110b.

Second Embodiment

FIG. 7 shows a semiconductor integrated circuit 311 according to a second embodiment of the present invention. The semiconductor integrated circuit 311 is powered from four power supplies 300, 301, 302 and 303 (including a ground potential or a reference potential) providing voltages V1, V2, V3 and V4, respectively, where V1>V2>V3>V4. V2 and V3 are supplied from power supplies 301 and 302, respectively, to a logic circuit 304, which includes a CMOS logic circuit. In the semiconductor integrated circuit 311, a differential amplification circuit 307 is provided. A voltage V, where V2>V>V3, is input to the differential amplification circuit 307 by a voltage supply circuit 306.

The output of the differential amplifier 307 is supplied to first conductivity type wells 308a and 308b in the logic circuit 304 and a CMOS logic-threshold-voltage generator 305, respectively. The CMOS logic-threshold-voltage generator 305 generates a voltage corresponding to the threshold voltage of the CMOS logic circuit of the logic circuit 304. The differential amplification circuit 307 employs V1 and V4 as power supply voltages. Furthermore, the output Vx of the amplifier 309 is supplied to the second conductivity type wells 310a and 310b in the logic circuit 304 and the CMOS logic-threshold-voltage generator 305, respectively.

In the second embodiment, the circuit is arranged in the same manner as in the first embodiment shown in FIG. 5 except that V1 and V4 are used as the power supply voltages of the differential amplifier 307. By using V1 and V4 as power supply voltages, the range of a potential supplied to the first well 308 can be drastically enlarged. For example, if the first wells 308a and 308b are n-wells, the potential of n-wells 308a and 308b, which can be determined by the output voltage of the differential amplifier 307, ranges from V1 to V2-φB (where φB is a built-in potential between the n-well and source p region of the p-channel MOSFET). Therefore, the potential can be controlled over a broad range.

FIG. 8 is a specific embodiment of the amplifier 309 that supplies Vx to the second well. An input voltage Vinput from a variable voltage power supply 312 is supplied to the differential amplifier 400 at a positive input terminal. A feedback potential, which is an output Vx of the differential amplifier 400 returned through a resistor 401, is supplied to the differential amplifier 400 at a negative input terminal. The Vx is thus formed and supplied to the second well 310. With this arrangement, by changing the output voltage of the power supply 312, it is possible to produce potentials suitable for an operation state and a stand-by state. Note that any power supply voltage may be employed for the differential amplifier 400.

Figure 9:
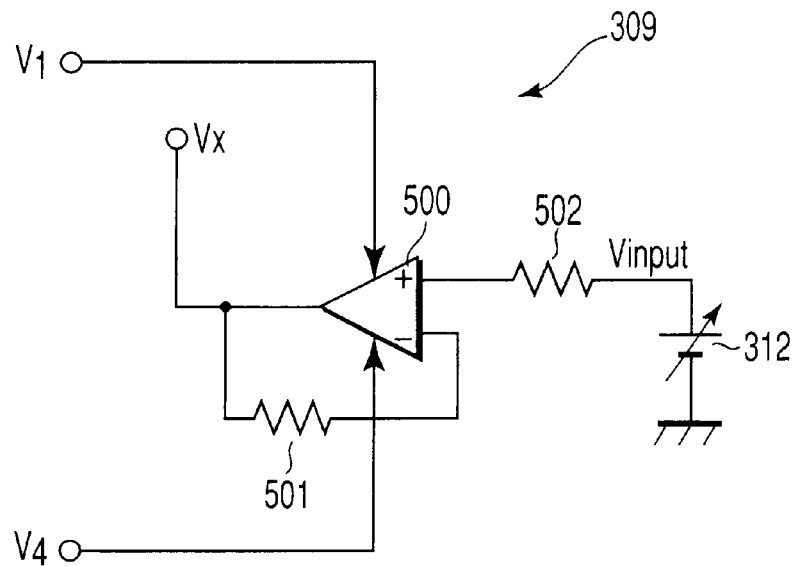
FIG. 9 is another voltage supply circuit for supplying a voltage to a second well, used in the second embodiment.

The amplifier 309 shown in FIG. 9 is essentially the same as that shown in FIG. 8. The amplifier 309 comprises a differential amplifier 500, resistors 501 and 502, and a variable voltage power supply 312. V1 and V4 are used as power supply voltages of the differential amplifier 500.

According to the circuit shown in FIG. 9, it is possible to enlarge an operation range of the differential amplifier 500. For example, if second wells 310a and 310b, to which the output terminal of the differential amplifier 500 is connected, are p-wells, the potential of the well 310, which can be determined by the output voltage of the differential amplifier 500, ranges from V4 to V3+φB (where φB is a built-in potential between the p-well and the source n-region of the n-channel MOSFET). Therefore, the potential can be controlled in a broad range.

Then, if the potential of a second well in the logic circuit is set within the range of V4 to V3+φB, and the potential of the first well is set within the range of V2-φB to V1, both the first well and the second well can be controlled in the broad range.

Now, an example of a semiconductor integrated circuit consistent with the present invention will be discussed with reference to FIG. 5. In this embodiment, a semiconductor integrated circuit manufactured through a 0.25 μm CMOS process will be discussed. The power supply voltages of V1, V2, V3, and V4 are set at 3V, 1.75V, 1.25V and 0V, respectively. It is presumed that the first well is an n-well and the second well is a p-well. The circuit of FIG. 6 is arranged as the CMOS logic-threshold-voltage generator 105 within the logic circuit 104. At this time, the gate widths of the p-channel MOSFET and the n-channel MOSFET are 2 μm and 1 μm, respectively, which are the same as those of an inverter in the logic circuit 104. V2 and V3 are used as power supply voltages for the logic-threshold-voltage generator 105. In the voltage supply circuit 106, two 2kΩ resistors connected in series divide the voltage applied by power supply voltages V1 and V4. Therefore, a voltage of 1.5V is supplied from the voltage supply circuit 106. Furthermore, the circuit shown in FIG. 10 is used as a differential amplifier 107 for supplying a potential to the first wells 108a and 108b (n well).

Figure 10:
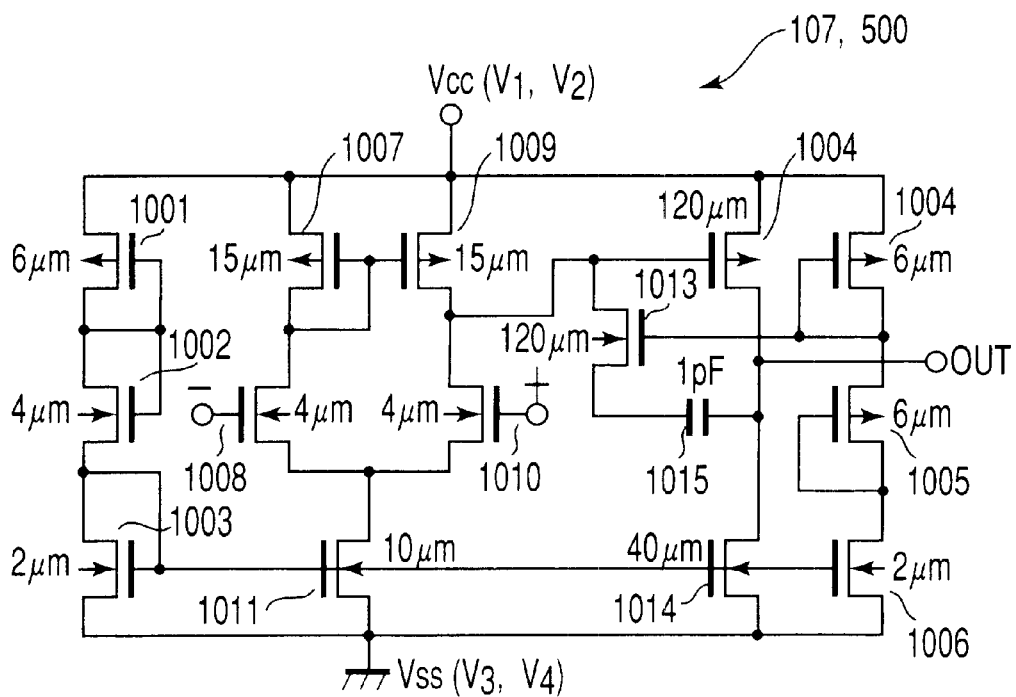
FIG. 10 is a voltage supply circuit for supplying a voltage to a first well, used in the first and second embodiments.

In FIG. 10, a first-stage comprises a differential amplifier having n-channel MOSFETs 1008 and 1010 each having a gate width of 4 μm. The differential output is converted into a single-phase output by a current mirror circuit of p-channel MOSFETs 1007 and 1009 each having a gate width of 15 μm. The single-phase output is outputted through a p-channel MOSFET 1004 having a gate width of 120 μm, and provided as a second-stage amplifier circuit. In the differential amplifier, to perform phase compensation, the output of the second-stage amplifier circuit is fed back into the input of the p-channel MOSFET 1004 having a gate width of 120 μm through a capacitor 1015 of 1.0 pF and the resistor produced by applying a fixed voltage to the gate of MOSFET 1013.

Furthermore, the circuit for supplying a potential to second wells 110a and 110b (p well) is arranged as shown in FIG. 9. A feedback resistor 501 and input resistor 502 of FIG. 9 are each 100 Ω. Furthermore, the differential amplifier 500 is the circuit shown in FIG. 10. An input voltage Vinput is applied by a variable voltage power supply 312.

In a differential amplifier 107 (500), which supplies a potential to wells 108a and 110a in the logic circuit 104, the n well of elements constituting the differential amplifier 107 is connected to V1 and the p well is connected to V4. Furthermore, V1 and V4 are used as power supply voltages in order to enlarge the range of output voltage. By virtue of the connection, the characteristics of the amplifier are not changed even if the negative feedback control is performed. At the same time, the output of the amplifier can be stabilized by use of battery power supplies as V1 and V4. This is because, depending upon the specifications, V2 and V3 may be the output of the power supply converter, instead of the output of the battery, and consequently, an alternate current noise such as a ripple may be superposed.

Figure 11:
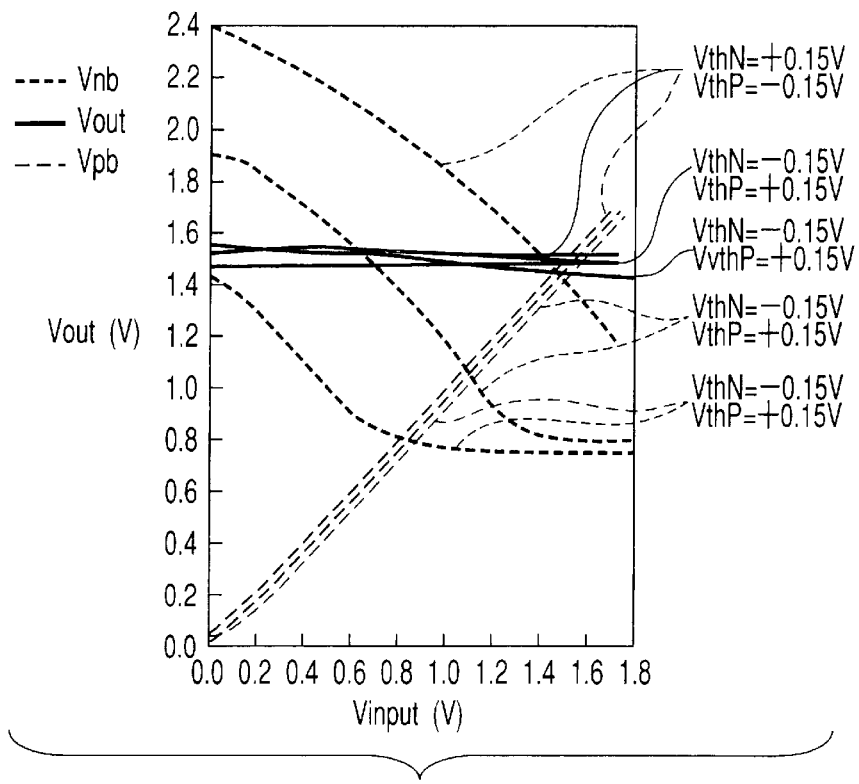
FIG. 11 is a graph showing a process dependency of a logic threshold voltage within a logic circuit in the first and second embodiments.

The circuit was arranged in the manner described above and the characteristics of the circuit were checked. The results will be explained below. FIG. 11 is a graph showing the results obtained by monitoring a logic threshold Vout of a logic circuit when the potential to the p-well is changed by varying an input Vinput to the differential amplifier 500 from 0 to 1.8V. Three MOSFET thresholds are shown when the well potential is equal to the source potential (i.e., Vsub=0). They are: 1) VthN=0.15V and VthP=−0.15V; 2) VthN=−0.05V and VthP=0.05V; and 3) VthN=−0.05V; and VthP=0.15V. As a reference, the potential Vnb of the n-well and the potential Vpb of the p-well are also shown. In this embodiment, when Vsub=0V, the threshold voltage of the n-channel MOSFET changes by 0.2V and the threshold voltage of the p-channel MOSFET changes by 0.2V. Nevertheless, the circuit threshold voltage falls within the range of about 70 mV from 1.55V to 1.48V. It is therefore demonstrated that the circuit margin is greatly increased according to the present invention.

Furthermore, the potential Vpb of the p-well can be widely changed from 0V to about 1.8V by varying the voltage of Vinput. By changing the voltage of Vinput widely in this way, the operations can be performed all the way from the stand-by mode to the high-speed operation mode.

Figure 12:
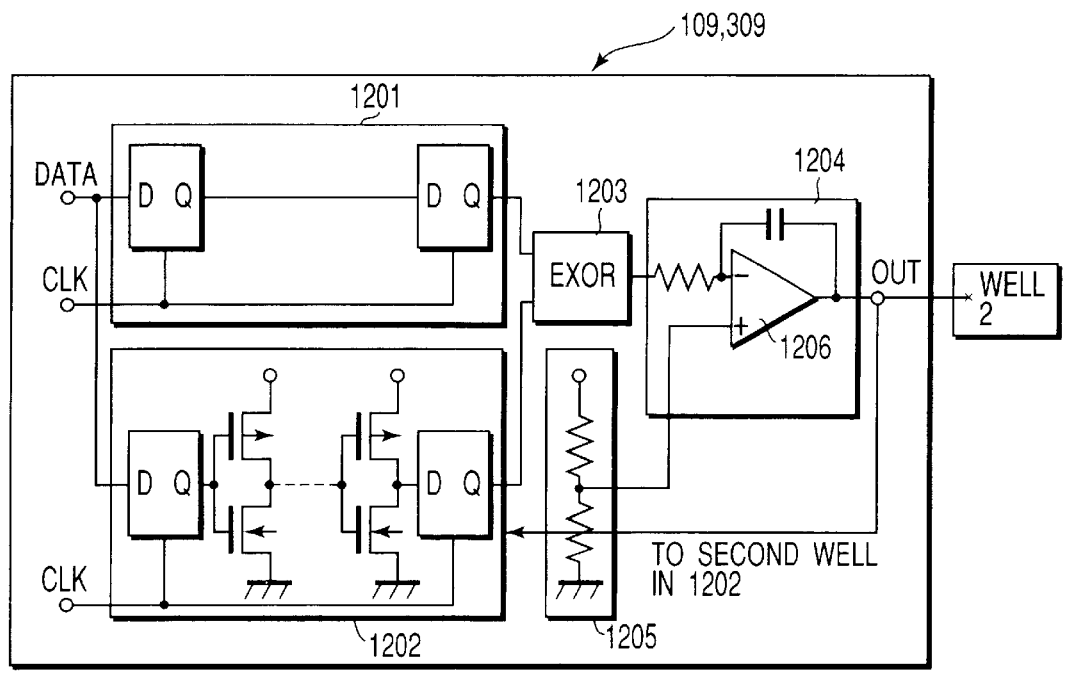
FIG. 12 is a voltage supply circuit for supplying a voltage to the second well used in the first and second embodiments.

Next, there will be explained a case in which the circuit shown in FIG. 12 is used as voltage supply circuits (second voltage supply circuit) 109 and 309 that supply potentials to a second well 110. In this case, a p well is used as the second well 110. The second voltage supply circuit comprises reference circuit 1201 having two stages of D flip-flops cascade-connected to control a speed, a test circuit 1202 having an even number of inverters arranged between the two stages of D flip-flops, an exclusive OR circuit 1203, an integral circuit 1204 using a differential amplifier 1206, and a reference voltage producing circuit 1205 comprising resistors dividing a voltage. The output terminal of the integral circuit is connected to a second well for the circuit 1202 including flip-flops and the second well 110 for the logic circuit 104.

The test circuit 1202 is a replica of the logic circuit 104 shown in FIG. 5 and has a delay time equal to the delay time in the logic circuit 104. The potential of the second well 110 of the logic circuit 104, which is an object to be controlled in practice, can be controlled by monitoring the operation speed of the test circuit 1202.

At this time, the potential is supplied to the second well of the circuit 1202 so as to operate at up to an extremely high frequency. Furthermore, V2 and V3 are used as power supply voltages for the reference circuit 1201, test circuit 1202, and the exclusive-OR (EXOR) circuit 1203. V1 and V4 are used as power supply voltages for the differential circuit 1206 and the reference voltage producing circuit 1205. Furthermore, the time constant of the integral circuit is a value in the order of from several hundreds $\mu$s to several ms, which is a sufficiently large value compared to that of the control circuit of the first well.

In this case, the circuit 1201 can be operated at up to an extremely high frequency. On the other hand, the exclusive OR circuit 1203 outputs "0" when the test circuit 1202 fails to transfer data at a predetermined clock frequency since the transfer delay time of the logic circuit is slow. As a result, the output of the integral circuit 1204 increases and the threshold voltage of the n-channel MOSFET within the test circuit 1202 shifts toward the minus direction. Therefore, the speed of the logic gate increases and the threshold voltage shifts towards a minus direction until the output of the test circuit 1202 finally matches with that of the reference circuit 1201. At the same time, the threshold voltage of the FET in the logic circuit 104 shifts toward a minus direction. As a result, the operation speed of the logic gate increases.

When the output of the test circuit 1202 matches with that of the reference circuit 1202, the output of the exclusive OR circuit 1203 becomes "1". The resultant output potential of the integral circuit 1204 reduces. The threshold voltage of the n-channel MOSFET decreases, with the result that the speed of the logic gate also decreases.

If the aforementioned control operation is repeated, the transfer delay time Tpd of the inverter in a logic circuit satisfies $$1/fclk = N \cdot Tpd + Tsetup + Thold$$

where fclk is a frequency of a clock, N is the number of steps of inverters of a test circuit, Tsetup is a set-up time of a flip-flop, and Thold is a holding time of a flip-flop. In the aforementioned embodiment, a p-well is used as a second well. However, an n-well may also be used if the connection of input of the differential amplifier is changed.

Figure 13:
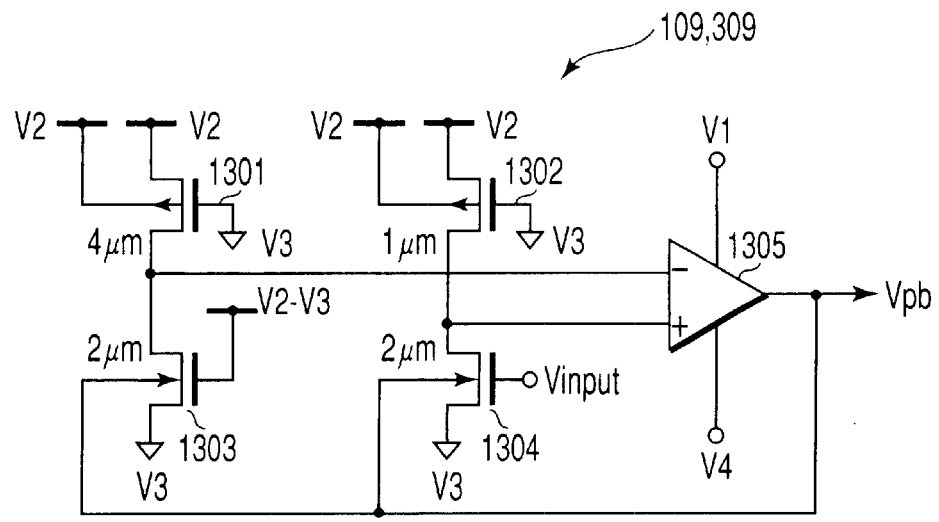
FIG. 13 is another voltage supply circuit for supplying a voltage to the second well used in the first and second embodiments.

Finally, there will be explained the case where the circuit of FIG. 13 is employed as a voltage supply circuit (second voltage supply circuit) 109 and 309 that supply potentials to the second well 110. In FIG. 13, the circuit comprises a p-channel MOSFET 1301 having a gate width of 4 $\mu$m, a p-channel MOSFET 1302 having a gate width of 1 $\mu$m, n-channel MOSFETs 1303 and 1304, and a differential amplifier 1305. The well potential of the p-channel MOSFET is V2 and the well potential of the n-channel MOSFET is supplied from the differential amplifier 1305.

Figure 14:
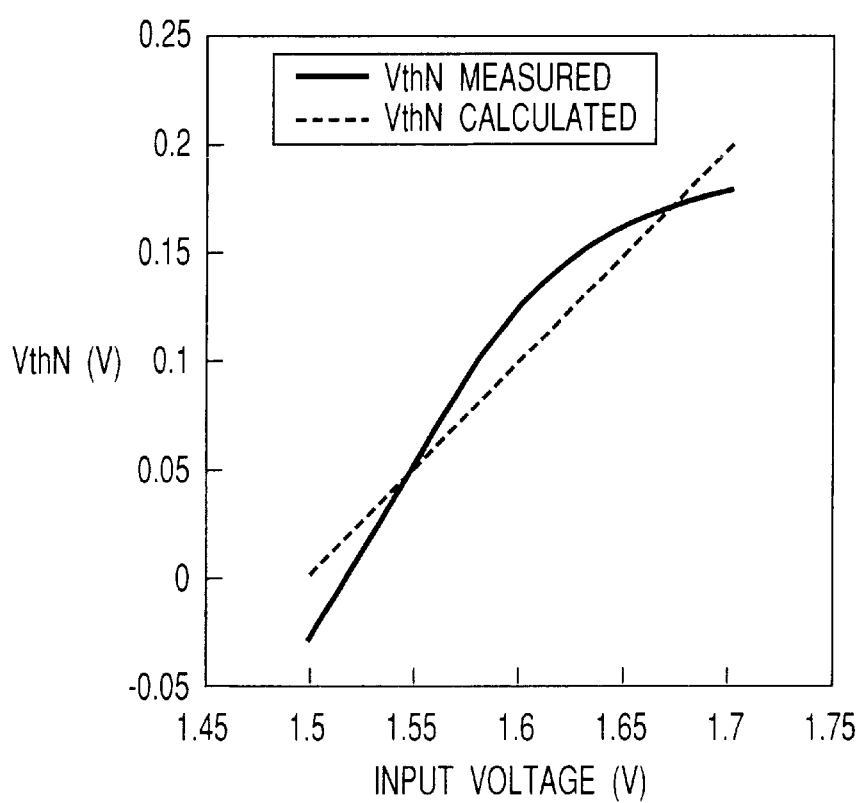
FIG. 14 is a graph showing the relationship between an input voltage and a threshold voltage of an n channel MOSFET in the voltage supply circuit shown in FIG. 13 with respect to the measured values and the calculated values.

In FIG. 13, a ratio of a saturation current of the n-channel MOSFET 1304 when a voltage Vinput is applied to a saturation current of the n-channel MOSFET 1303 when V2–V3 is applied to the gate is about 4:1. Generally, since the saturation current of the MOSFET is $K(Vgs-Vth)^2$ (where Vgs is a voltage between a gate and a source; Vth is a threshold voltage, K is a K factor), when V2=1.75V, and V3=1.25V, VthN can be approximated as Vinput–0.25. If the value of Vinput is changed, VthN satisfying the aforementioned equation can be obtained. The circuit according to this embodiment was actually constructed and evaluated. The evaluation results are shown in FIG. 14.

VthN is a threshold voltage of an FET installed in a logic circuit for monitoring. vthN is the gate/source voltage when a current is 0.1 $\mu$A per 1 $\mu$m of the gate width. The line of VthN=Vinput–0.25 is also shown in FIG. 14 as a reference. From the graph, it is clear that the threshold voltage of an n-channel MOSFET can be controlled quite accurately by use of the circuit of this embodiment. Furthermore, if the Vinput is fixed in the circuit, the off-current can be set at almost a constant value regardless of the threshold voltage determined by a manufacturing process.

The circuit arrangements shown in FIGS. 5–7 are each one example. For instance, variously modified arrangements may be applied as described below:

1) External power supply voltages V2 and V3 can be formed from V1 and V4 by use of a power supply voltage converter;

2) The power supply voltage converter can be arranged within the semiconductor integrated circuit;

3) A desired voltage V of a voltage supply circuit can be produced from V2 and V3 by dividing V2–V3 using resistors;

4) A logic gate having a more complicated arrangement than the NAND gate or NOR gate can be used as a CMOS logic-threshold voltage generator;

5) A p-well can be used as the first conductivity type well and an n-well can be used as the second conductivity type well;

6) When the output terminal of the differential amplifier is connected to the p-well, V2 and V4 can be used as the power supply voltages of the differential amplifier and when the same is connected to the n-well, V1 and V3 can be used as the power supply voltages the differential amplifier.

In the aforementioned embodiments, a MOSFET is used. However, a MISFET (Metal-Insulator-Semiconductor Field-Effect Transistor), in which various gate insulating films are used and are not limited to a silicon oxide film, may be applied consistent with the present invention.

As described, according to embodiments consistent with the present invention, in a semiconductor integrated circuit having a logic circuit having an extremely low voltage amplitude of about 0.5V, it is possible to compensate the threshold voltage of a first conductivity channel type MOSFET which varies depending upon the manufacturing process conditions for the device. The well potential of the first conductivity channel type MOSFET can be controlled so as to be operated within a logic circuit at a maximum operation margin. Furthermore, it is possible to control the threshold voltage of the second conductivity channel type MOSFET so as to satisfy a desired specification with respect to power consumption during the stand-by time and a speed during the operation. Therefore, it is possible to attain a semiconductor integrated circuit for a portable electronic device in a high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a semiconductor substrate having a first well of a first conductivity type, a second well of a first conductivity type, a first well of a second conductivity type, and a second well of a second conductivity type;
a complementary MIS logic circuit having first elements formed in the first well of the first conductivity type and second elements formed in the first well of the second conductivity type;
a logic-threshold-voltage generator for generating a voltage corresponding to a logic threshold voltage of the complementary MIS logic circuit, having a third element formed in the second well of the first conductivity type and a fourth element formed in the second well of the second conductivity type;
a first voltage supply circuit for supplying a first voltage V having a magnitude between a first and a second power supply voltage to the complementary MIS logic circuit, wherein the second power supply voltage is a reference voltage and different from the first power supply voltage;
a differential amplification circuit wherein an output voltage of the logic-threshold-voltage generator is input to a positive terminal of the differential amplification circuit and wherein the first voltage V is input to a negative input terminal of the differential amplification circuit; and
a second voltage supply circuit for supplying a second voltage Vx, wherein
an output voltage of the differential amplification circuit is supplied to the first well of the first conductivity type wells in which the first elements of the complementary MIS logic circuit are formed, and supplied to the second well of the first conductivity type, in which the third element of the logic-threshold-voltage generator is formed; and
the second voltage s supplied to the first well of the second conductivity type in which the second elements of the complementary MIS logic circuit are formed and supplied to the second well of the second conductivity type, in which the fourth element of the logic-threshold-voltage-generator is formed.

2. The semiconductor integrated circuit according to claim 1, wherein the logic threshold voltage of the complementary MIS logic circuit is set at the first voltage V by a negative feedback control of the differential amplification circuit.

3. The semiconductor integrated circuit according to claim 1, wherein the voltage V is a median value of the first and the second power supply voltage.

4. The semiconductor integrated circuit according to claim 1, wherein the first well and the second well of the first conductivity type are formed as a same well, and the first well and the second well of the second conductivity type are formed as a same well.

5. A semiconductor integrated circuit comprising:
a semiconductor substrate having a first well of a first conductivity type, a second well of a first conductivity type, a first well of a second conductivity type, and a second well of a second conductivity type;
first, second, third and fourth power supply lines to which first, second, third, and fourth power supplies outputting voltages V1, V2, V3, and V4 are connected, respectively, wherein V1>V2>V3>V4;
a complementary MIS logic circuit, wherein power supply terminals of the complementary MIS logic circuit are connected to the second power supply line and the third power supply line, the complementary MIS logic circuit including a second conductivity channel type MISFET formed in the first well of the first conductivity type and a first conductivity channel type MISFET formed in the first well of the second conductivity type;
a logic-threshold-voltage-generator for generating a voltage corresponding to a logic threshold voltage of the complementary MIS logic circuit, having a first circuit element formed in the second well of the first conductivity type and a second circuit element formed in the second well of the second conductivity type;
a first voltage supply circuit for supplying a first voltage V satisfying V2>V>V3;
a first differential amplification circuit wherein an output voltage of the logic-threshold-voltage-generator is input to a positive input terminal of the amplification circuit and wherein the first voltage V is input to a negative input terminal of the amplification circuit; and
a second voltage supply circuit for supplying a second voltage Vx,
wherein an output terminal of the differential amplification circuit is connected to the first and second wells of the first conductivity; and
the second voltage Vx is supplied to the first and second wells of the second conductivity type.

6. The semiconductor integrated circuit according to claim 5, wherein the logic-threshold-voltage generator comprises a first conductivity channel type MISFET having a first source, a first drain, and a first gate, and a second conductivity channel type MISFET having a second source, a second drain and a second gate, wherein the second source is connected to the second power supply line, wherein the first source is connected to the third power supply line, and wherein the first and the second gate and the first and the second drain are connected to each other.

7. The semiconductor integrated circuit according to claim 5, wherein power supply terminals of the first differential amplification circuit are connected to the first power supply line and the fourth power supply line, wherein the elements of the first differential amplification circuit are formed in a third well of the first conductivity type and third well of the second conductivity type, wherein the third well of the first conductivity type is electrically isolated from the first and the second wells of the first conductivity type, and wherein the third well of the second conductivity type is electrically isolated from the first and the second well of the second conductivity type wells.

8. The semiconductor integrated circuit according to claim 7, wherein the third well of the first conductivity type is connected to the second power supply line and the third well of the second conductivity type is connected to the third power supply line.

9. The semiconductor integrated circuit according to claim 5, wherein the first voltage V output from the first voltage supply circuit is equal to (V2+V3)/2.

10. The semiconductor integrated circuit according to claim 5, wherein, when the first conductivity type is an n-type and the second conductivity type is a p-type, the output voltage Vx of the second voltage supply circuit is set at a value lower than V3 during a stand-by time and set at a value higher than V3 during an operation time.

11. The semiconductor integrated circuit according to claim 5, wherein, when the first conductivity type is an n-type and the second conductivity type is a p-type, a potential of the second well in the logic circuit is set to a value ranging from V4 to V3+φB and a potential of the first well is set to a value ranging from V2−φB to V1, where φB is a built-in potential between the first or the second well and a corresponding source.

12. The semiconductor integrated circuit according to claim 5, wherein, when the first conductivity type is an n-type and the second conductivity type is a p-type, power supply terminals of the first differential amplification circuit are connected to the first power supply line and the third power supply line, and power supply terminals of the second voltage supply circuit are connected to the second power supply line and the fourth power supply line.

13. The semiconductor integrated circuit according to claim 5, wherein the first conductivity type is an n-type and the second conductivity type is a p-type, and the first differential amplification circuit comprises:
 a first power supply terminal for receiving a voltage higher than a reference voltage;
 a second power supply terminal for receiving the reference voltage;
 a p-channel type first MISFET having a first source, a first drain, and a first gate, wherein the first source is connected to the first power supply terminal and the first gate is connected to the first drain;
 an n-channel type second MISFET having a second source, a second drain, and a second gate, wherein the second drain is connected to the first drain and the second gate is connected to the second drain;
 an n-channel type third MISFET having a third source, a third drain, and a third gate, wherein the third drain is connected to the second source, the third gate is connected to the third drain, and the third source is connected to the second power supply terminal;
 a p-channel type fourth MISFET having a fourth source, a fourth drain, and a fourth gate, wherein the fourth source is connected to the first power supply terminal and the fourth gate is connected to the fourth drain;
 a p-channel type fifth MISFET having a fifth source, a fifth drain, and a fifth gate, wherein the fifth source is connected to the fourth drain and the fifth gate is connected to the fifth drain;
 an n-channel type sixth MISFET having a sixth source, a sixth drain, and a sixth gate, wherein the sixth drain is connected to the fifth drain, the sixth gate is connected to the third gate; and the sixth source is connected to the second power supply terminal;
 a p-channel type seventh MISFET having a seventh source, seventh drain, and a seventh gate, wherein the seventh source is connected to the first power supply terminal, and the seventh gate is connected to the seventh drain;
 an n-channel type eighth MISFET having an eighth source, an eighth drain, and an eighth gate, wherein the eighth drain is connected to the seventh drain;
 a first input terminal connected to the eighth gate;
 a p-channel type ninth MISFET having a ninth source, ninth drain and a ninth gate, wherein the ninth source is connected to the first power supply terminal, and the ninth gate is connected to the seventh gate;
 an n-channel type tenth MISFET having a tenth source, a tenth drain and a tenth gate, wherein the tenth drain is connected to the ninth drain and the tenth source is connected to the eighth source;
 a second input terminal connected to the tenth gate;
 an n-channel type eleventh MISFET having an eleventh source, an eleventh drain and an eleventh gate, wherein the eleventh drain is connected to the tenth source, the eleventh gate is connected to the third gate, and the eleventh source is connected to the second power supply terminal;
 a p-channel type twelfth MISFET having a twelfth source, a twelfth drain and a twelfth gate, wherein the twelfth source is connected to the first power supply terminal and the twelfth gate is connected to the ninth drain;
 an output terminal connected to the twelfth drain;
 an n-channel type thirteenth MISFET having a thirteenth source, a thirteenth drain and a thirteenth gate, wherein the thirteen drain is connected to the ninth drain;
 a capacitor having one end connected to the thirteenth source; and
 an n-channel type fourteenth MISFET having a fourteenth source, a fourteenth drain and a fourteenth gate, wherein the fourteenth drain is connected to another end of the capacitor, the fourteenth gate is connected to the third gate, and the fourteenth source is connected to a second power supply terminal.

14. The semiconductor integrated circuit according to claim 5, wherein, the first conductivity type is an n-type and the second conductivity type is a p-type, and the second voltage supply circuit comprises:
 a reference circuit comprising a first and a second D-type flip-flop connected in series, a first data input terminal connected to an input terminal of the first D-type flip-flop, and a first internal output terminal connected to an output terminal of the second D-type flip-flop;
 a test circuit comprising a third and a fourth D-type flip-flop having an even number of in-series inverters interposed therebetween, a second data input terminal connected to an input terminal of the third D-type flip-flop, and a second internal output terminal connected to an output terminal of the fourth D-type flip-flop;
 an exclusive logic circuit having a first and a second internal input terminal and a third internal output terminal, wherein the first internal input terminal is connected to the first internal output terminal of the reference circuit, and the second internal input terminal is connected to the second internal output terminal of the test circuit;
 an integral circuit having a third and a fourth internal input terminal and an external output terminal, the integral circuit comprising a second differential amplifier having a positive input terminal connected to the fourth internal input terminal, a capacitor connected between the external output terminal and a negative input terminal of the second differential amplifier and a resistor connected between the negative input terminal and the third internal input terminal, wherein the third internal input terminal is connected to the third internal output terminal of the exclusive logic circuit; and
 a reference voltage producing circuit having a first and a second power supply terminal and a reference voltage output terminal, wherein the reference voltage output terminal is connected to the fourth internal input terminal, wherein the external output terminal is connected to a p-type well in which an n-channel type MOSFET included in the test circuit is formed.

15. The semiconductor integrated circuit according to claim 14, wherein the test circuit has a same delay time as that of the complementary MIS logic circuit.

16. The semiconductor integrated circuit according to claim 14, wherein power supply voltages of the reference circuit, the test circuit, and the exclusive logic circuit are V2 and V3, and power supply voltages of the second differential amplification circuit and the reference voltage producing circuit are V1 and V4.

17. The semiconductor integrated circuit according to claim 14, wherein the reference voltage producing circuit outputs a voltage divided by two resistors connected in series between the first and the second power supply terminal as the reference voltage.

18. The semiconductor integrated circuit according to claim 14, wherein a time constant of the integral circuit is larger than that of the first differential amplification circuit.

19. A semiconductor integrated circuit according to claim 5, wherein the first conductivity type is an n-type, the second conductivity type is a p-type, and the second voltage supply circuit comprises:

a fifth power supply line for supplying a difference voltage between the voltage V2 and the voltage V3;

an input terminal to which an arbitrary voltage is applied;

a p-type first MISFET having a first source, a first drain and a first gate, wherein the first source is connected to the second power supply line, the first gate is connected to the third power supply line, and a third well, in which the first MISFET is formed, is connected to the second power supply line;

an n-type second MISFET having a second source, a second drain and a second gate, wherein the second drain is connected to the first drain, the second gate is connected to the fifth power supply line, and the second source is connected to the third power supply line;

a p-type third MISFET having a third source, a third drain, and a third gate, wherein the third source is connected to a second power supply line, the first gate is connected to the third power supply line, and a fourth well, in which the third MISFET is to be formed, is connected to the second power supply line;

an n-type fourth MISFET having a fourth source, a fourth drain, and a fourth gate, wherein the fourth drain is connected to the third drain, the fourth gate is connected to the input terminal, and the fourth source is connected to the third power supply line;

a second differential amplification circuit powered from the first power supply line and the fourth power supply line, having a positive input terminal connected to the third drain, a negative input terminal connected to the first drain, and an output terminal connected to a fifth and a sixth well in which the second MISFET and the fourth MISFET are formed, respectively; and a second voltage supply terminal connected to the output terminal for supplying the second voltage Vx.

20. The semiconductor integrated circuit according to claim 19, wherein a saturation current of the second MISFET is about four times as large as a saturation current of the fourth MISFET.

* * * * *

UNITED STATES PATENT AND TRADEMARK OFFICE
CERTIFICATE OF CORRECTION

PATENT NO.     : 6,455,901 B2
DATED          : September 24, 2002
INVENTOR(S)    : Kameyama et al.

It is certified that error appears in the above-identified patent and that said Letters Patent is hereby corrected as shown below:

<u>Column 15,</u>
Line 44, change "second voltage s supplied" to -- second voltage Vx is supplied --.

<u>Column 18,</u>
Line 19, change "thirteen drain" to -- thirteenth drain --.

Signed and Sealed this

Eighth Day of July, 2003

JAMES E. ROGAN
*Director of the United States Patent and Trademark Office*